US007675088B2

(12) United States Patent  
Huang et al.

(10) Patent No.: US 7,675,088 B2
(45) Date of Patent: Mar. 9, 2010

(54) MANUFACTURING METHOD OF THIN FILM TRANSISTOR ARRAY SUBSTRATE

(75) Inventors: Jun-Yao Huang, Taipei County (TW); Kuang-Cheng Fu, Kaohsiung County (TW); Jen-Chieh Lin, Kinmen County (TW); Chin-Lung Yeh, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 12/256,456

(22) Filed: Oct. 22, 2008

(65) Prior Publication Data

US 2009/0061553 A1 Mar. 5, 2009

Related U.S. Application Data

(62) Division of application No. 11/649,238, filed on Jan. 4, 2007.

(30) Foreign Application Priority Data

Sep. 5, 2006 (TW) .............................. 95132726 A

(51) Int. Cl.
*H01L 21/336* (2006.01)
(52) U.S. Cl. ........................................ 257/171; 257/149
(58) Field of Classification Search .......... 257/E21.411; 438/34
See application file for complete search history.

(56) References Cited

U.S. PATENT DOCUMENTS

| | | | | |
|---|---|---|---|---|
| 5,822,026 A * | 10/1998 | Matsuo | ........................ | 349/38 |
| 5,838,037 A * | 11/1998 | Masutani et al. | ............ | 257/296 |
| 6,387,737 B1 | 5/2002 | Yamazaki et al. | | |
| 6,404,465 B1 * | 6/2002 | Nakayama et al. | ............ | 349/39 |
| 2007/0218601 A1 * | 9/2007 | Seo et al. | ..................... | 438/151 |

OTHER PUBLICATIONS

"Office Action of Taiwan counterpart application", issued on Aug. 10, 2009, p. 1-p. 7.

* cited by examiner

*Primary Examiner*—Wai-Sing Louie
*Assistant Examiner*—Bilkis Jahan
(74) *Attorney, Agent, or Firm*—Jianq Chyun IP Office

(57) ABSTRACT

A thin film transistor array substrate and the manufacturing method thereof are disclosed herein. A first patterned metal layer, an insulating layer, a patterned layer, and a second patterned metal layer are sequentially formed on a substrate. Then, a number of scan lines and a number of source lines are disposed on the substrate and define a number of pixel regions. A number of the storage capacitance lines are disposed on the substrate in a direction extending along the scan lines and across the pixel regions, wherein each of the storage capacitance lines is essentially perpendicular to each of the source lines and to form a cross portion. A number of patterned thin films are disposed on the storage capacitance lines and above the cross portion.

6 Claims, 4 Drawing Sheets

MANUFACTURING METHOD OF THIN FILM TRANSISTOR ARRAY SUBSTRATE

CROSS-REFERENCE TO RELATED APPLICATION

This application is a divisional of an application Ser. No. 11/649,238, filed on Jan. 4, 2007, now pending, which claims the priority benefit of Taiwan application serial no. 95132726, filed on Sep. 5, 2006. The entirety of each of the above-mentioned patent applications is hereby incorporated by reference herein and made a part of this specification.

BACKGROUND OF THE INVENTION

1. Field of the Invention

The present invention generally relates to a liquid crystal display device, and more particularly relates to a thin film transistor (TFT) array substrate for the liquid crystal display device and the manufacturing method thereof.

2. Description of the Prior Art

FIG. 1 is illustrated a plane view of the liquid crystal display according to the prior art. Referring to FIG. 1, scan lines 102 and source lines 109 are disposed to cross to define a plurality of pixel regions. The storage capacitance line (Cs line) 104 is extended over the pixel region to cross the source line 109. An omhic contact thin film 106, a source electrode 110 and a drain electrode 111 are disposed on the scan line 102. Besides, a pixel electrode 114 is disposed in the pixel region. Wherein, scan lines 102 and the Cs lines 104 are simultaneously formed and there is an insulating layer, not shown in the figure, covered thereon. The Cs line 104 is electrically isolated by the insulating layer and is under crossing the source line 109.

Due to the fact that the complex metal is used, it is difficult to control a good profile of the taper angle because of the etching rate of different materials so as to easily cause the undercut effect. Such as shown in FIG. 2, it is the sectional view of the A-A' cross-section of FIG. 1 at the cross portion of the source line 109 and the storage capacitance line 104, the undercut effect presents at the Cs line 104 of the first metal layer arranged on a substrate 100. An insulating layer 103 is formed on the Cs line 104 of the first metal layer and then a source line 109 of a second metal layer is formed on the Cs line 104 of the first metal layer. Because of the undercut effect of the first metal layer, it easily causes the rip of the insulating layer 103 so as to occur the short of the source line 109 and the Cs line 104. This defect will cause the light line of the liquid crystal display device while turning on the panel and this panel must perform the array test to find the defect and perform the laser repair. Further, the panel is scrapping. Hence, how to overcome the mentioned problem is important for enhancing the yield of the LCD panel.

SUMMARY OF THE INVENTION

In order to solve the mentioned problem, the present invention is directed to a thin film transistor array substrate and the manufacturing method thereof. It utilizes a patterned thin film disposed at the cross portion of the source lines and the Cs lines and between two layers so as to solve the short problem at the cross portion.

The present invention is further directed to a thin film transistor array substrate and the manufacturing method thereof. It only needs to add a pattern in the second photo-mask to dispose a plurality of patterned thin films at the cross portion of the source lines and the Cs lines without using the extra photo-mask in the process and effectively prevent the short problem causing from the rip of the insulating layer at the cross portion of the source lines and the Cs lines.

The present invention is further directed to a thin film transistor array substrate and the manufacturing method thereof. The structure of the cross portion of the source lines and the Cs lines is improved to effectively enhance the yield rate of the product and can apply to the liquid crystal display device with all kinds of size.

The present invention is further directed to a thin film transistor array substrate and the manufacturing method thereof. It utilizes a patterned thin film arranged at the cross portion of source lines and scan lines and between two layers so as to solve the short problem between source lines and scan lines.

The present invention is further directed to a thin film transistor array substrate and the manufacturing method thereof. It can reduce the frequency for the laser repair and the array testing time to effectively control the product yield without changing the process conditions.

Accordingly, one embodiment of the present invention provides a thin film transistor array substrate including: a substrate; a plurality of scan lines and a plurality of source lines disposed on the substrate, and define a plurality of pixel regions on the substrate; a plurality of storage capacitance lines disposed on the substrate in a direction extending along the scan lines and across the pixel regions, each of the storage capacitance lines is essentially perpendicular to each of the source lines and to form a cross portion; and a plurality of patterned thin films disposed on those storage capacitance lines and above the cross portion.

Another embodiment of the present invention provides a manufacturing method of a thin film transistor array substrate. The manufacturing method includes: forming a first patterned metal layer on a substrate to define a plurality of scan lines and a plurality of storage capacitance lines, the storage capacitance lines disposed in a direction extending along the scan lines; forming an insulating layer on the first patterned metal layer; forming a second patterned metal layer to define a plurality of source lines, the source lines and the scan line define a plurality of pixel regions, and each of the storage capacitance lines is essentially perpendicular to each of the source lines and to form a cross portion; and forming a patterned layer on the insulating layer to define a plurality of patterned thin films disposed on the storage capacitance lines and above the cross portion.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
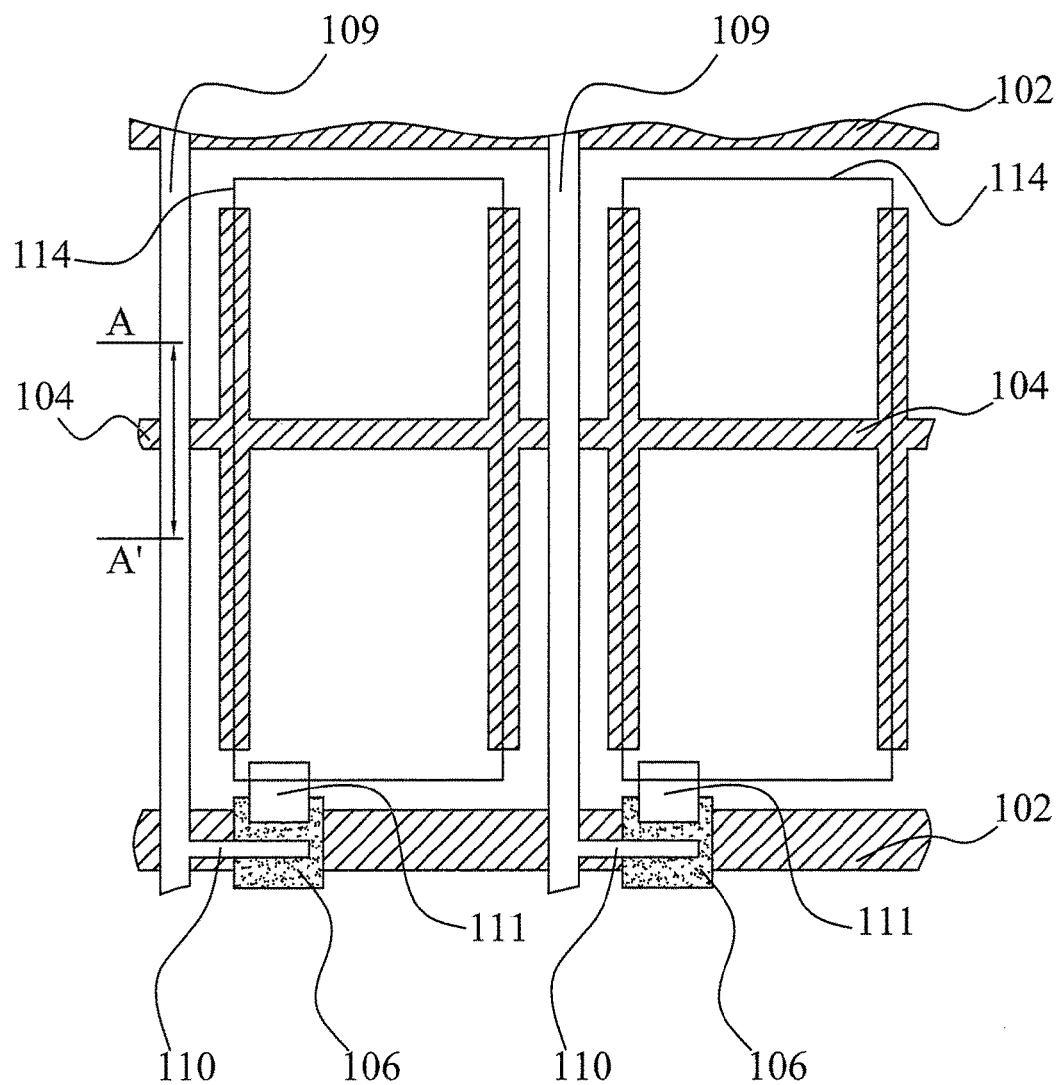
FIG. 1 is a plane view of a liquid crystal display according to the prior art.
Figure 2:
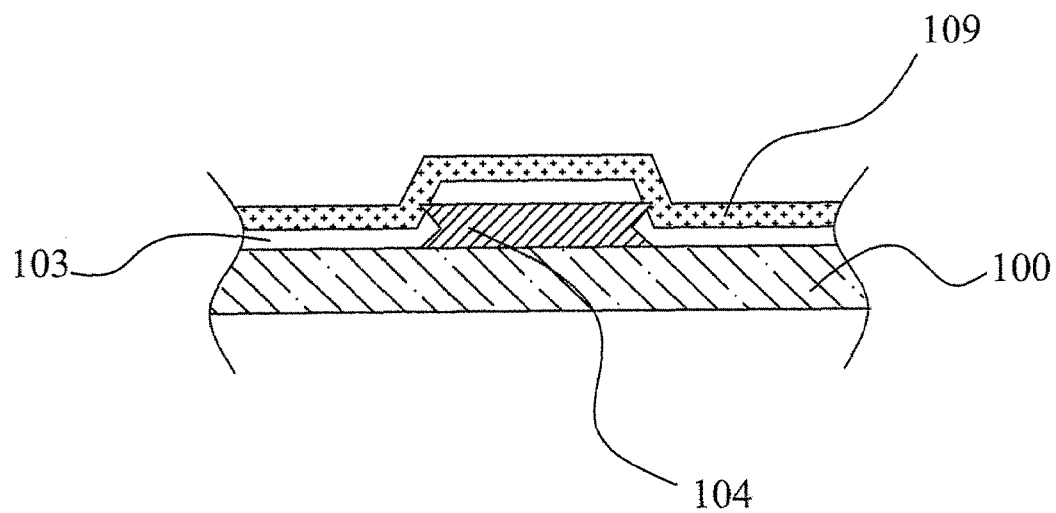
FIG. 2 is a sectional view of A-A' cross-section of FIG. 1 according to the prior art.
Figure 3:
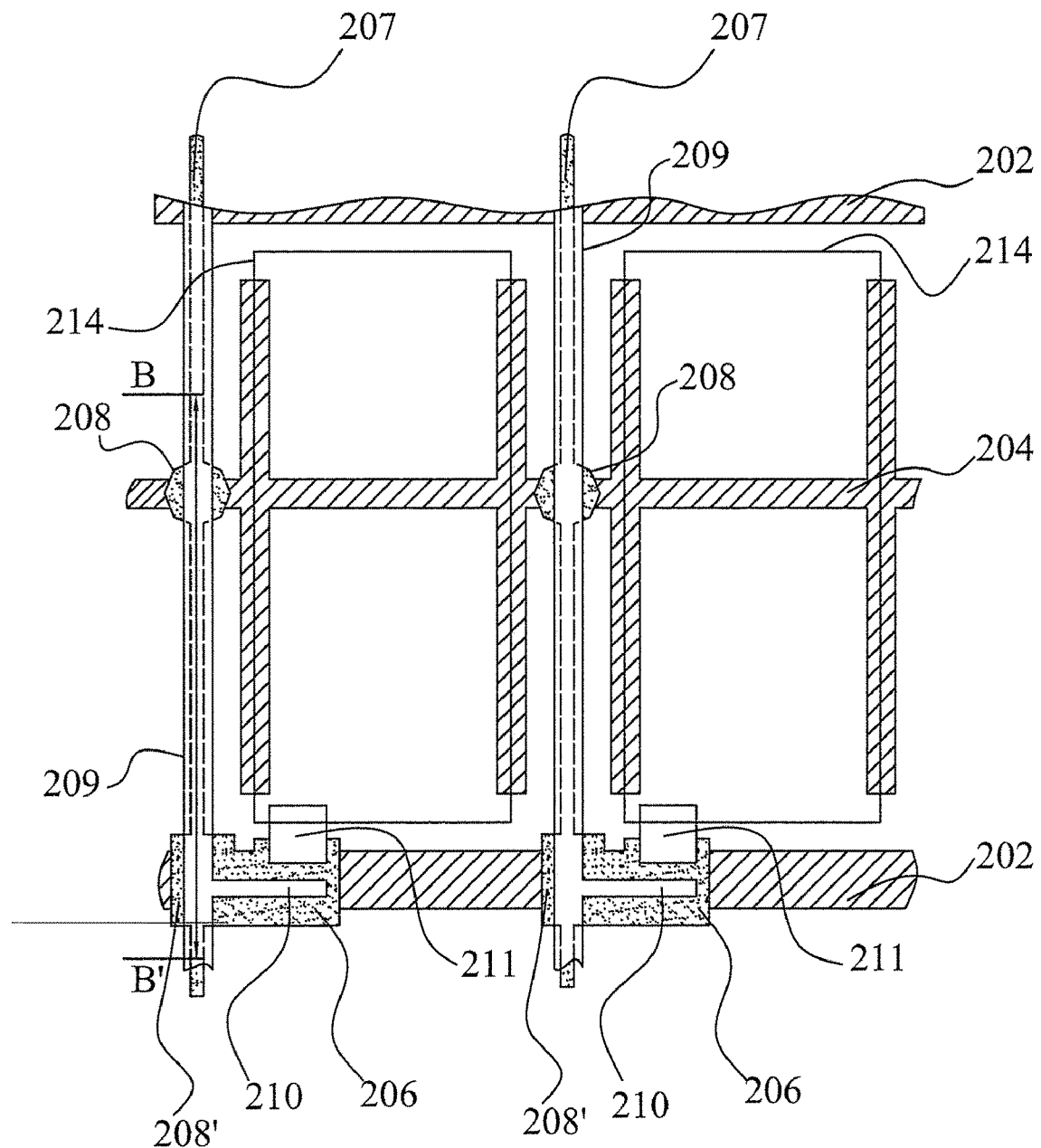
FIG. 3 is a plane view of a thin film transistor array substrate according to one embodiment of the present invention.

FIG. 3 is a plane view of the thin film transistor array substrate illustrated one embodiment of the present invention.

Such as shown in FIG. 3, in the present embodiment, a thin film transistor (TFT) array substrate includes a plurality of scan lines 202 and a plurality of source lines 209 disposed on the substrate and define a plurality of pixel regions. A plurality of storage capacitance lines (Cs line) 204 are disposed on the substrate in a direction extending along to across the pixel regions, and each of Cs lines 204 is essentially perpendicular to each of the source lines 209 to form a cross portion. A plurality of patterned thin films 208 are disposed on Cs lines 204 and above the cross portion.

Following the foregoing, in the present embodiment, the scan lines 202 and the Cs lines 204 are simultaneously formed in the same process. After, an insulating layer (not shown FIG. 3) is disposed to cover the scan lines 202 and the Cs lines 204. Wherein, the patterned thin films 208 are disposed on the insulating layer. Further, at the cross portion of the scan lines 202 and the source lines 209, the patterned thin film 208' could be disposed on the scan lines 202 at the cross portion and between two layers to cover the cross portion. In the present embodiment, each of the pixel regions comprises a pixel electrode 214 disposed on Cs lines 204 in the pixel regions and each of the pixel regions further comprises a transistor electrically connected with the pixel electrode. Further, as simultaneously forming the patterned thin film 208 and the patterned thin film 208', an omhic contact thin film 206 for the transistor is simultaneously formed. Besides, a source electrode 210 and a drain electrode 211 are simultaneously formed with the source lines 209.

In one embodiment, the manufacturing method of TFT array substrate is sequentially forming a first patterned metal layer, an insulating layer, a patterned layer and a second patterned metal layer on a substrate. The first patterned metal layer is defined the scan lines and the Cs lines, and the second patterned metal layer is defined source lines. The description of the further layout of the pixel of the TFT array substrate is the same as the mentioned above.

Figure 4:
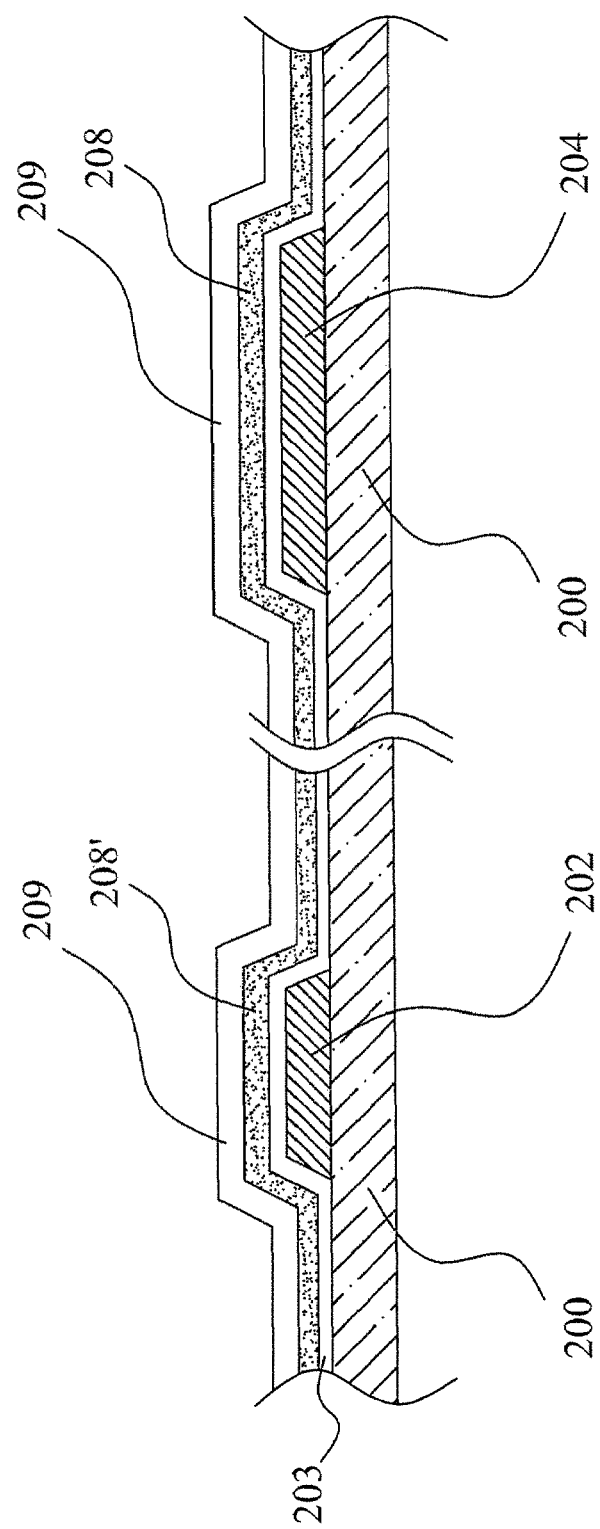
FIG. 4 is a sectional view of B-B' cross-section of FIG. 3 according to one embodiment of the present invention.

FIG. 4 is the sectional view of B-B' cross-section of FIG. 3 illustrated the cross portion of the source lines 209 and the Cs lines 204 and the cross portion of the source lines 209 and the scan lines 202. Following the foregoing and referring to FIG. 4, at the cross portion of the source lines 209 and the Cs lines 204, a Cs line 204, an insulating layer 203, a plurality of patterned thin films 208 and a source line 209 are respectively disposed on a substrate 200. Such as shown in FIG. 4, the patterned thin films 208 are disposed on the Cs line 204 and above the cross portion of the source lines 209 and the Cs lines 204. Hence, even the metal layer of the Cs line 204 provided with a bad profile of the taper angle to produce the undercut effect to cause the rip of the insulating layer 203, because of the protection from the patterned thin films 208, it prevents the short problem of the source lines 209 and the Cs lines 204.

Referring to FIG. 3 and FIG. 4, in one embodiment, the manufacturing method of a TFT array substrate for a liquid crystal display device includes the following steps. First, a first patterned metal layer is formed on a substrate 200 to define a plurality of scan lines 202 and a plurality of Cs lines 204 on the substrate. Wherein, the Cs lines 204 are disposed along the scan lines 202. Then, an insulating layer 203 is formed on the first patterned metal layer. Next, a second patterned metal layer is formed to define a plurality of source lines 209 to cross the scan lines 202 so as to define a plurality of pixel regions. Wherein, the second patterned metal layer further defines a plurality of source electrodes 210 and a plurality of drain electrodes 211. Besides, the Cs lines 204 are disposed to extend over the pixel regions and to cross under the source lines 209. After, a patterned layer 207 is formed on the insulating layer 203 to define a plurality of patterned thin films 208 disposed on the Cs lines 204 at the cross portion of the Cs lines 204 and the source lines 209 to cover the cross portion. In one embodiment, the patterned layer 207 is a semiconductor layer. A plurality of pixel electrodes 214 are disposed on the Cs lines 204 in the pixel regions and a plurality of transistors are respectively disposed on the scan lines 202 in pixel region and electrically connect with the pixel electrodes. Further, the patterned layer 207 is also defined an omhic contact thin film 206 of those transistor and a plurality of patterned thin film 208' disposed on the scan lines 202 and above the cross portion of the scan lines 202 and the source lines 209 to cover the cross portion. In the present embodiment, it can utilize the photolithography process to form the patterned films or materials on the substrate. For example, after depositing the transparent conductive layer, it can utilize the photolithography process to define the pixel electrode.

Accordingly, one of features is to utilize the layer originally formed between the first patterned metal layer and the second patterned metal layer of the TFT array substrate, except for the insulating layer, to further improve the isolation at the cross portion therebetween. The original layer is further disposed a patterned thin film on the insulating layer on the Cs line at the cross portion of the source line and the Cs line to provide the isolation and to prevent the short problem at the cross portion. Such as shown in FIG. 3, the patterned thin films 208, patterned thin films 208' and the omhic contact thin film 206 are linked. It could be understood that the patterned thin films 208' and the omhic contact thin film 206 could be respectively isolated patterns.

To sum up the forgoing, the present invention utilizes a patterned thin film disposed on the Cs lines at the cross portion of the source lines and the Cs lines and between two layers to completely solve the short problem at the cross portion. The present prevents the short problem causing from the rip of the insulating layer at the cross portion by adding a pattern in the second photo-mask to arrange a plurality of patterned thin films at the cross portion without using the extra photo-mask in the process. The structure of the cross portion of the source lines and the Cs lines is improved to effectively control and enhance the yield of the product without changing process conditions and can apply to the liquid crystal display device with all kinds of size and can reduce the frequency for the laser repair and the array test time.

While the present invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A manufacturing method of a thin film transistor array substrate, comprising:

forming a first patterned metal layer on a substrate to define a plurality of scan lines and a plurality of storage capacitance lines, the storage capacitance lines disposed in a direction extending along the scan lines;

forming an insulating layer on the first patterned metal layer;

forming a second patterned metal layer to define a plurality of source lines, the source lines and the scan line define a plurality of pixel regions, and each of the storage capacitance lines is essentially perpendicular to each of the source lines to form a cross portion; and forming a patterned semiconductor layer on the insulating layer to define a plurality of patterned thin films disposed on the storage capacitance lines and above the cross portion.

2. The manufacturing method of a thin film transistor array substrate according to claim 1, further comprising the step of forming a plurality of pixel electrodes in the pixel regions.

3. The manufacturing method of a thin film transistor array substrate according to claim 1, further comprising the step of forming a plurality of transistors in the pixel regions to electrically connect with the pixel electrodes.

4. The manufacturing method of a thin film transistor array substrate according to claim 3, further comprising the step of forming each source electrode and each drain electrode of the transistors at the second patterned metal layer.

5. The manufacturing method of a thin film transistor array substrate according to claim 3, further comprising the step of forming an omhic contact thin film for each of the transistors at the patterned semiconductor layer.

6. The manufacturing method of a thin film transistor array substrate according to claim 1, further comprising the step of forming the patterned thin films on the scan lines at a cross portion of the scan lines and the source lines to cover the cross portion.

* * * * *